(12) United States Patent
Hsu et al.

(10) Patent No.: US 11,488,837 B2
(45) Date of Patent: Nov. 1, 2022

(54) METHOD FOR FABRICATING HIGH-VOLTAGE (HV) TRANSISTOR

(71) Applicant: United Microelectronics Corp., Hsinchu (TW)

(72) Inventors: Chia-Jung Hsu, Tainan (TW); Chun Yu Chen, Taichung (TW); Chin-Hung Chen, Tainan (TW); Chun-Ya Chiu, Tainan (TW); Chih-Kai Hsu, Tainan (TW); Ssu-I Fu, Kaohsiung (TW); Yu-Hsiang Lin, New Taipei (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 100 days.

(21) Appl. No.: 17/030,158

(22) Filed: Sep. 23, 2020

(65) Prior Publication Data

US 2022/0093411 A1    Mar. 24, 2022

(51) Int. Cl.

| | | |
|---|---|---|
| *H01L 21/324* | (2006.01) | |
| *H01L 21/28* | (2006.01) | |
| *H01L 29/66* | (2006.01) | |
| *H01L 29/06* | (2006.01) | |
| *H01L 21/02* | (2006.01) | |
| *H01L 21/311* | (2006.01) | |

(52) U.S. Cl.
CPC .... *H01L 21/3247* (2013.01); *H01L 21/28167* (2013.01); *H01L 29/66477* (2013.01); *H01L 21/02238* (2013.01); *H01L 21/02255* (2013.01); *H01L 21/28238* (2013.01); *H01L 21/31105* (2013.01); *H01L 29/0649* (2013.01)

(58) Field of Classification Search
None
See application file for complete search history.

(56) References Cited

U.S. PATENT DOCUMENTS

| | | | |
|---|---|---|---|
| 9,577,069 B1 * | 2/2017 | Pu | ..................... H01L 21/28123 |
| 9,716,139 B2 | 7/2017 | Chen et al. | |
| 9,741,850 B1 | 8/2017 | Hsiao et al. | |
| 2001/0045597 A1 * | 11/2001 | Nishinohara | ....... H01L 29/7834 257/E29.267 |
| 2005/0068806 A1 * | 3/2005 | Hurst | ..................... G11C 11/15 257/E27.005 |
| 2005/0130378 A1 * | 6/2005 | Huang | ............ H01L 21/823418 257/E21.624 |

(Continued)

FOREIGN PATENT DOCUMENTS

JP       2012028562 A   *   2/2012

OTHER PUBLICATIONS

Machine language translation of JP 2012-28562A (Year: 2012).*

*Primary Examiner* — Erik Kielin
(74) *Attorney, Agent, or Firm* — J.C. Patents

(57) ABSTRACT

A method for fabricating a high-voltage (HV) transistor is provided. The method includes providing a substrate, having a first isolation structure and a second isolation structure in the substrate and a recess in the substrate between the first and second isolation structures. Further, a hydrogen annealing process is performed over the recess. A sacrificial dielectric layer is formed on the recess. The sacrificial dielectric layer is removed, wherein a portion of the first and second isolation structures is also removed. A gate oxide layer is formed in the recess between the first and second isolation structures after the hydrogen annealing process.

10 Claims, 10 Drawing Sheets

(56) References Cited

U.S. PATENT DOCUMENTS

2007/0037340 A1\* 2/2007 Birner ............... H01L 21/76224
  257/E21.654
2008/0012067 A1\* 1/2008 Wu ..................... H01L 29/4236
  257/E21.429

\* cited by examiner

METHOD FOR FABRICATING HIGH-VOLTAGE (HV) TRANSISTOR

BACKGROUND OF THE INVENTION

Field of the Invention

The invention relates to semiconductor fabrication technology, and particularly related to a method for fabricating a high-voltage (HV) transistor.

Description of Related Art

As the development of the various functions of electronic products, the control circuit may need to drive the high-voltage (HV) devices as operated in high-voltage level and the low-voltage (LV) devices as operated in low-voltage level. As to the operation of HV device and the LV device, the power module in an example needs to provide the HV power source and the LV power source. The HV circuit as operated at the HV level would involve the HV transistors for performing various function.

The HV transistor in the HV integrated circuit is the essential part. Various designs for the HV transistors have been provided in the market. The conventional HV transistor may still be based on the silicon as the channel in operation. To adapt the thick gate insulation layer for HV operation, the channel level is brough down with respect to the top surface of the silicon wafer to have a recess portion in the substrate.

However, a roughness of the substrate at the recess portion is at least an issue needed to be considered because the recess is to be formed as the HV channel. The roughness of to surface of the recess may affect the performance of the HV channel for the HV transistor.

SUMMARY OF THE INVENTION

The invention provides a HV transistor. The channel of the HV transistor as a recess portion is lower than the top surface of the substrate, so that the HV gate insulation layer with large thickness may be form in the recess. The invention may have less roughness for the surface of the channel. The performance of the HV channel may be improved.

In an embodiment, the invention provides a method for fabricating a high-voltage (HV) transistor. The method includes providing a substrate, having a first isolation structure and a second isolation structure in the substrate and a recess in the substrate between the first and second isolation structures. Further, a hydrogen annealing process is performed over the recess. A sacrificial dielectric layer is formed on the recess. The sacrificial dielectric layer is removed, wherein a portion of the first and second isolation structures is also removed. A gate oxide layer is formed in the recess between the first and second isolation structures after the hydrogen annealing process.

In an embodiment, as to the method for fabricating HV transistor, the hydrogen annealing process is performed at a temperature in a range of 700° C. to 750° C.

In an embodiment, as to the method for fabricating HV transistor, the substrate has a doped structure including a doped well region in the substrate, wherein the first and second isolation structures are in the doped well region and the recess is also in doped well region. A first HV field doped region is in the doped well region, surrounding a bottom surface of the first trench isolation. A second HV field doped region is in the doped well region, surrounding a bottom surface of the second trench isolation. A gap is between the first HV field doped region and the second HV field doped region under the recess.

In an embodiment, as to the method for fabricating HV transistor, the doped structure in the substrate id formed before the recess is formed.

In an embodiment, as to the method for fabricating HV transistor, the hydrogen annealing process smooths a roughness of a bottom surface of the recess, including reducing a horn structure at bottom periphery of the recess between the substrate and the first and second isolation structures.

In an embodiment, as to the method for fabricating HV transistor, the sacrificial dielectric layer is formed by performing a rapid thermal oxidation over the recess.

In an embodiment, as to the method for fabricating HV transistor, the gate oxide layer is a HV gate oxide layer and a bottom of the gate oxide layer id between a top and a bottom of the first trench isolation structure or the second trench isolation structure.

In an embodiment, as to the method for fabricating HV transistor, the substrate includes an epitaxial silicon layer formed on a base substrate, and the first and second trench isolation are in the epitaxial silicon layer.

In an embodiment, as to the method for fabricating HV transistor, the step of forming the gate oxide layer includes a thermal oxidation layer to oxidize the substrate within the recess.

In an embodiment, as to the method for fabricating HV transistor, a gas in the hydrogen annealing process is 100% of hydrogen.

In an embodiment, the invention also provides a method for fabricating a high-voltage (HV) transistor, including providing a substrate, having a first isolation structure and a second isolation structure in the substrate and a recess in the substrate between the first and second isolation structures. A sacrificial dielectric layer is formed on the recess. The sacrificial dielectric layer is removed, wherein a portion of the first and second isolation structures is also removed. A hydrogen annealing process is performed over the recess. A gate oxide layer is formed in the recess between the first and second isolation structures after the hydrogen annealing process.

In an embodiment, as to the method for fabricating HV transistor, the hydrogen annealing process is performed at a temperature in a range of 700° C. to 750° C.

In an embodiment, as to the method for fabricating HV transistor, the substrate has a doped structure including a doped well region in the substrate, wherein the first and second isolation structures are in the doped well region and the recess is also in doped well region. A first HV field doped region is in the doped well region, surrounding a bottom surface of the first trench isolation. A second HV field doped region is in the doped well region, surrounding a bottom surface of the second trench isolation. A gap is between the first HV field doped region and the second HV field doped region under the recess.

In an embodiment, as to the method for fabricating HV transistor, the doped structure in the substrate id formed before the recess is formed.

In an embodiment, as to the method for fabricating HV transistor, the hydrogen annealing process smooths a roughness of a bottom surface of the recess, including reducing a horn structure at bottom periphery of the recess between the substrate and the first and second isolation structures.

In an embodiment, as to the method for fabricating HV transistor, the sacrificial dielectric layer is formed by performing a rapid thermal oxidation over the recess.

In an embodiment, as to the method for fabricating HV transistor, the gate oxide layer is a HV gate oxide layer and a bottom of the gate oxide layer id between a top and a bottom of the first trench isolation structure or the second trench isolation structure.

In an embodiment, as to the method for fabricating HV transistor, the substrate includes an epitaxial silicon layer formed on a base substrate, and the first and second trench isolation are in the epitaxial silicon layer.

In an embodiment, as to the method for fabricating HV transistor, the step of forming the gate oxide layer includes a thermal oxidation layer to oxidize the substrate within the recess.

In an embodiment, as to the method for fabricating HV transistor, a gas in the hydrogen annealing process is 100% of hydrogen.

BRIEF DESCRIPTION OF THE DRAWINGS

In order to make the aforementioned and other objectives and advantages of the present invention comprehensible, embodiments accompanied with figures are described in detail below.

DESCRIPTION OF THE EMBODIMENTS

The invention is directed to a semiconductor device of HV transistor, in which the channel of the HV transistor is a recess region between two trench isolations. The surface roughness of the substrate at the recess, serving as channel, may be effectively reduced.

Multiple embodiments are provided for describing the invention but the invention is not just limited to the embodiments as provided.

FIG. 1A to FIG. 1E are drawings, schematically illustrating a method for fabricating a HV transistor as looking into, according to an embodiment of the invention.

Figure 1A:
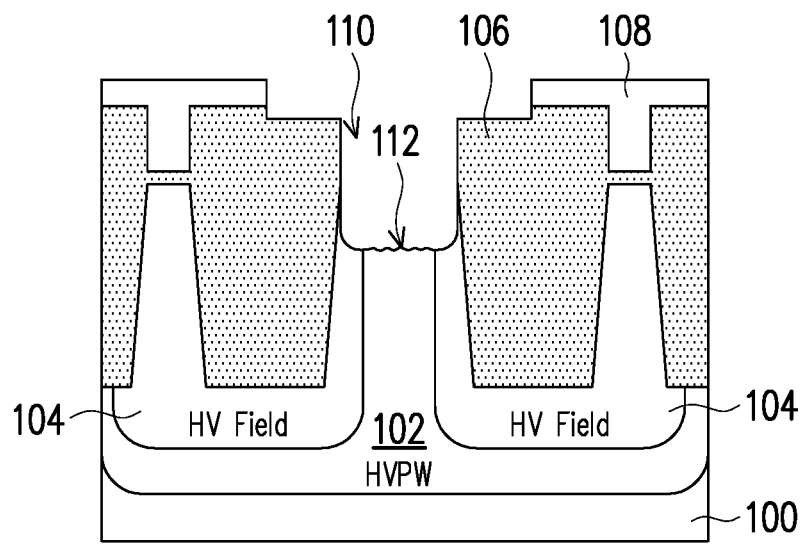
FIG. 1A to FIG. 1D are drawings, schematically illustrating a method for fabricating a HV transistor as looking into, according to an embodiment of the invention.

Referring to FIG. 1A, a preliminarily structure of a HV transistor has been fabricated on the substrate 100. The trench isolations 106 are formed in the substrate 100 to define a region for subsequently forming the HV channel. The trench isolations 106 in an embodiment may protrude up from the substrate 100.

Depending on the conductive type of the HV transistor to be fabricated, various doped well and doped regions are also formed in the substrate 100. In an embodiment, a doped well 102 such as the HV P-type well (HVPW) is formed in the substrate 100. Two HV field regions 104 are formed within the doped well 102. Those various doped regions may be formed before or after the trench isolations 106 are formed.

A mask layer 108 is formed over the substate 100 but expose a region of the substrate 100 between the two trench isolations 106, in which the HV channel would be formed later. The substates 100 as exposed by the mask layer 108 is etched to have a recess 110 between the two trench isolations 106. Depending on the etchant with a etching selection ratio, the trench isolations 106 such as oxide may also be slightly etched by a certain amount. The etchant for the etching process has higher etching selection to silicon. The space of the recess 110 is used to form the HV gate insulation layer, the surface portion of the substrate 100 at the recess is also preserved to form the HV channel in operation.

Usually, the etching process would cause roughness at the recess surface 112, which is involved in HV channel in actual operation of HV transistor. The roughness at the recess surface 112 may reduce the performance of the HV channel and need to be reduced.

Figure 1B:
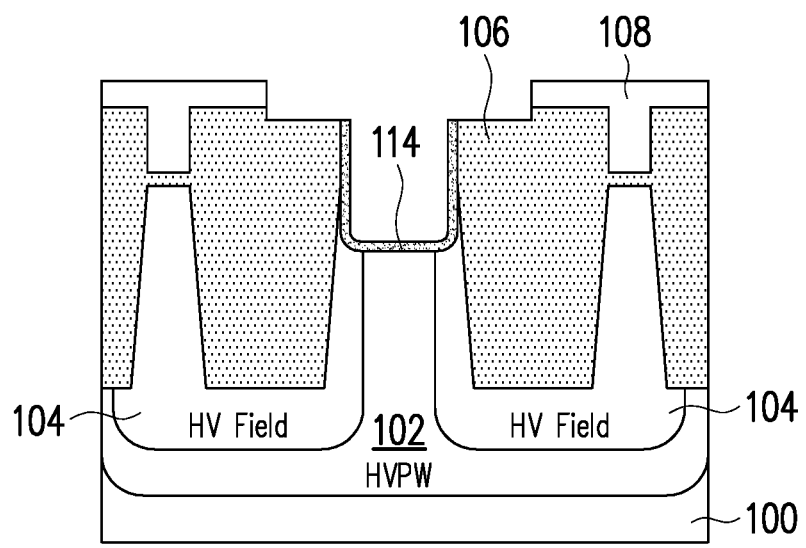

Referring to FIG. 1B, to reduce the surface roughness, a thermal oxidation is performed over the recess 110 to form a sacrificial dielectric layer 114, such as sacrificial oxide layer, at least oxidizing the recess surface 112. The sacrificial dielectric layer 114 may preliminarily reduce the roughness of the recess surface 114 of the substrate 100 between the trench isolations 106.

Figure 1C:
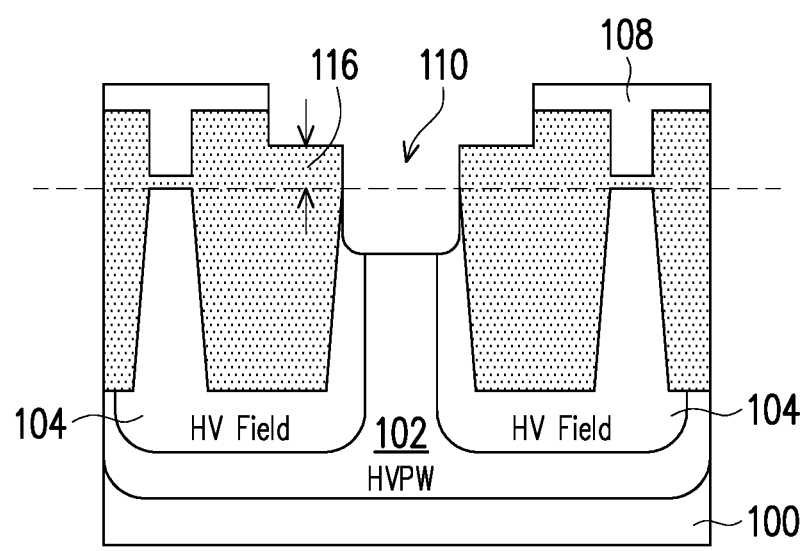
Figure 1D:
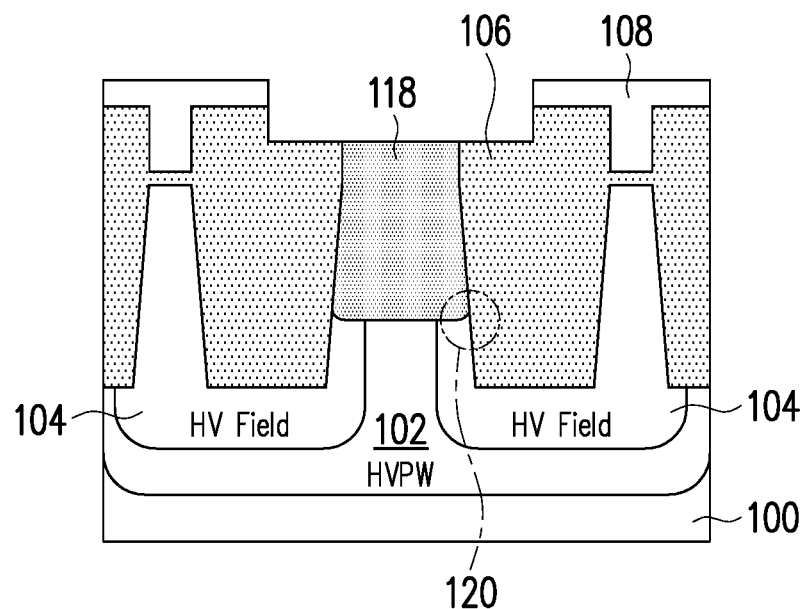
Figure 1D:
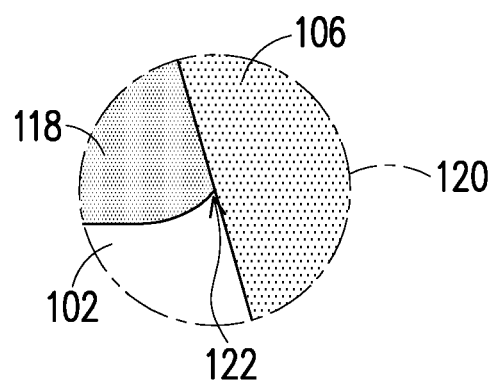

Referring to FIG. 1C, the sacrificial dielectric layer 114 is removed by etching process. In addition, the etching process may also etch trench isolations 106 to control the protruding portion 116 of the trench isolations 106 protruding from the substrate 100. As a result, the total depth of the recess 110 is corresponding to the thickness of a HV gate insulation layer 118 as to be formed in FIG. 1D.

Referring to 1D, the HV gate insulation layer 118 is formed by rapid thermal isolation process in an example to fill the space of the recess 110.

The invention has looked into the structure at the recess surface 112 according to the fabrication flow in FIG. 1A to FIG. 1D. Although the surface roughness may be reduced by forming the sacrificial dielectric layer 114 in FIG. 1B, the defect of silicon horn 112 has been observed at the edge region 120 of the substrate 100 at the recess surface 112, which is also interfacing with the trench isolations 106. This silicon horn 122 may also reduce the performance of the HV channel, since the HV channel under the HV gate insulation layer 118 would include the silicon horn 122.

After looking into the issue above, in an embodiment, the invention propose the further modification to at least further reduce the silicon horn 122.

Figure 2A:
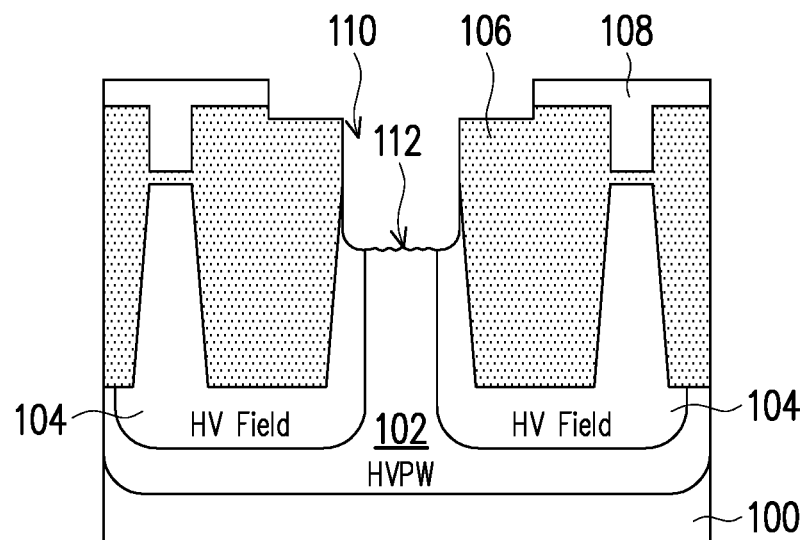
FIG. 2A to FIG. 2E are drawings, schematically illustrating a method for fabricating a HV transistor, according to an embodiment of the invention.

FIG. 2A to FIG. 2E are drawings, schematically illustrating a method for fabricating a HV transistor, according to an embodiment of the invention. Referring to FIG. 2A, it is the same as the preliminary structure in FIG. 1A. The same reference numbers represent the same elements and the descriptions are omitted here. However, as noted, the recess surface 112 of the recess 110 is from the silicon material being etched.

The recess surface 112 has the roughness need to be more efficiently removed.

Figure 2B:
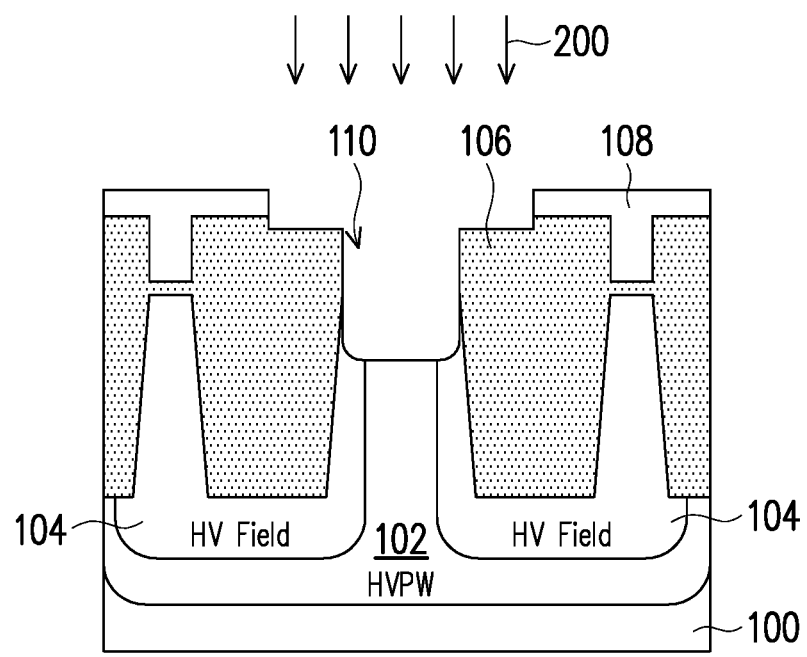

Referring to FIG. 2B, a hydrogen annealing process 200 is performed over the recess 110 on the recess surface 112. The roughness at the recess surface 112 may be reduced due to silicon migration under the hydrogen annealing process 200. In an embodiment, the hydrogen annealing process 200 may use the pure hydrogen at a temperature in a range of 700° C. to 750° C. In addition, the operation duration may be few minutes and the pressure may be properly applied.

Figure 2C:
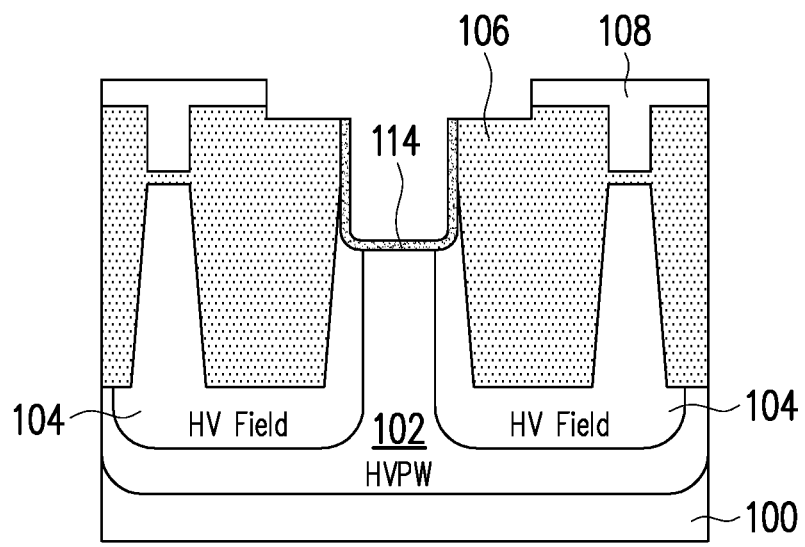

Referring FIG. 2C, to further reduce the surface roughness, a thermal oxidation is performed over the recess 110 to form a sacrificial dielectric layer 114, such as sacrificial oxide layer, at least oxidizing the recess surface 112. The sacrificial dielectric layer 114 may preliminarily reduce the roughness of the recess surface 114 of the substrate 100 between the trench isolations 106.

Figure 2D:
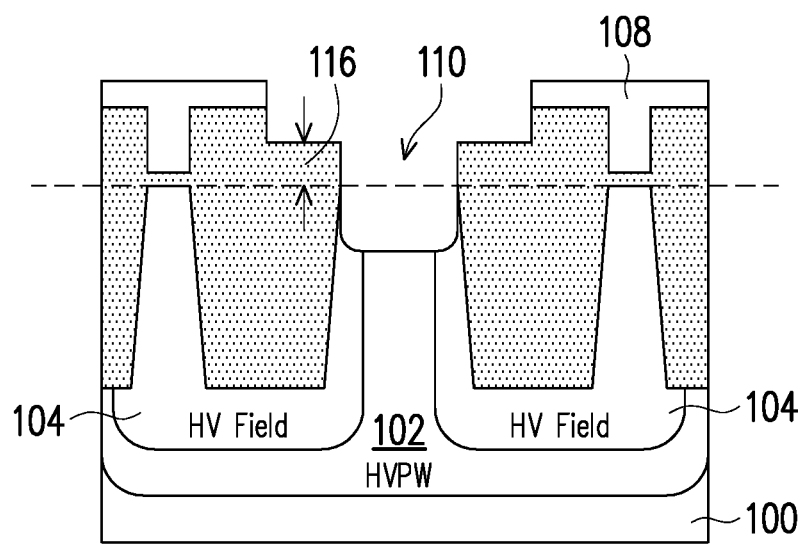

Referring to FIG. 2D, the sacrificial dielectric layer 114 is removed by etching process. In addition, the etching process may also etch trench isolations 106 to control the protruding portion 116 of the trench isolations 106 protruding from the substrate 100. As a result, the total depth of the recess 110 is corresponding to the thickness of a HV gate insulation layer 118 as to be formed in FIG. 2E.

Figure 2E:
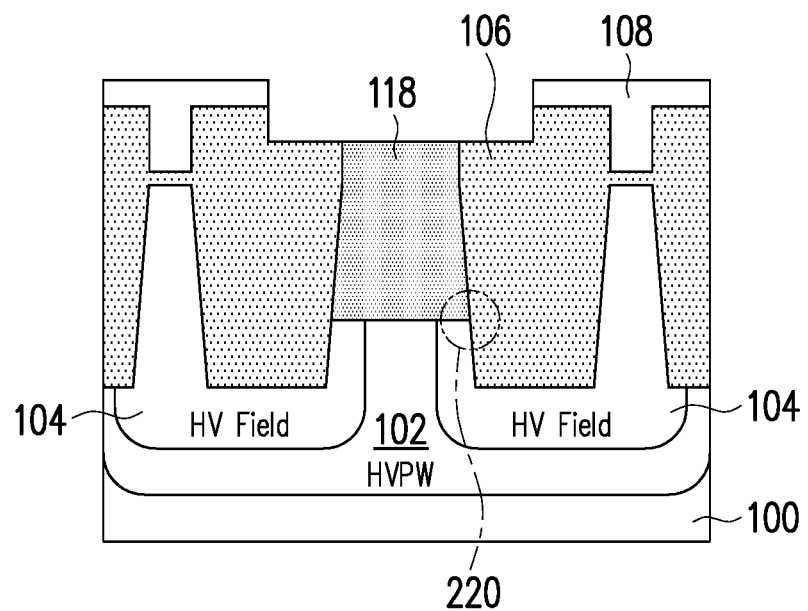
Figure 2E:
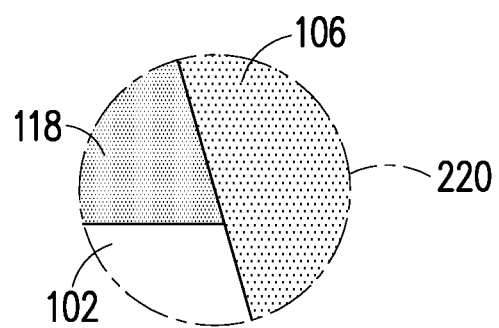

Referring to FIG. 2E, the HV gate insulation layer 118 is formed by rapid thermal isolation process in an example to fill the space of the recess 110.

As noted, the HV gate insulation layer 118 is interfacing with the recess portion of the substrate 100 between the trench isolations 106. The hydrogen annealing process 200 for silicon migration in FIG. 2B has been performed. As a result, the interface surface between the HV gate insulation layer 118 and the substrate 100 is at smooth condition. In addition, the silicon horn 122 as observed in FIG. 1D may be effectively reduced. As inspecting on the edge region 220 of the substrate 100 in the recess 110, the silicon horn is substantially reduced while comparing with the structure at the edge region 120 of FIG. 1D. The HV channel under the HV gate insulation layer 118 gets a smooth path in better condition for the channel current and the performance of HV channel may be improved.

The subsequent processes to complete the HV transistor may be taken based on the known processes, according to the structure at FIG. 2D. The further descriptions are omitted.

With the same aspect, the procedure in FIG. 2A to FIG. 2E may be modified. FIG. 3A to FIG. 3E are drawings, schematically illustrating a method for fabricating a HV transistor, according to an embodiment of the invention.

Figure 3A:
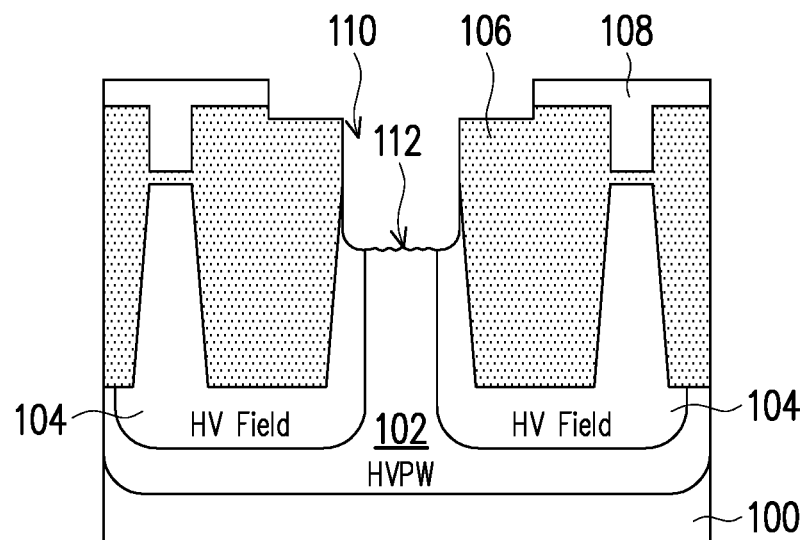
FIG. 3A to FIG. 3E are drawings, schematically illustrating a method for fabricating a HV transistor, according to an embodiment of the invention.

Referring to FIG. 3A, it is similar to FIG. 2A and the descriptions are omitted here.

Figure 3B:
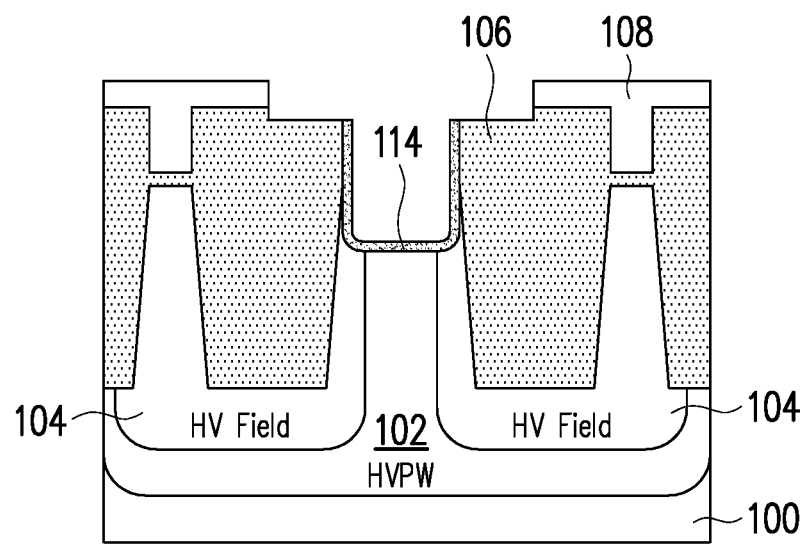

Referring to FIG. 3B, it may be noted that the hydrogen annealing process 200 as described in FIG. 2B is not performed yet. However likewise to FIG. 2C, to reduce the surface roughness, a thermal oxidation is performed over the recess 110 to form a sacrificial dielectric layer 114, such as sacrificial oxide layer, at least oxidizing the recess surface 112. The sacrificial dielectric layer 114 may preliminarily reduce the roughness of the recess surface 114 of the substrate 100 between the trench isolations 106.

Figure 3C:
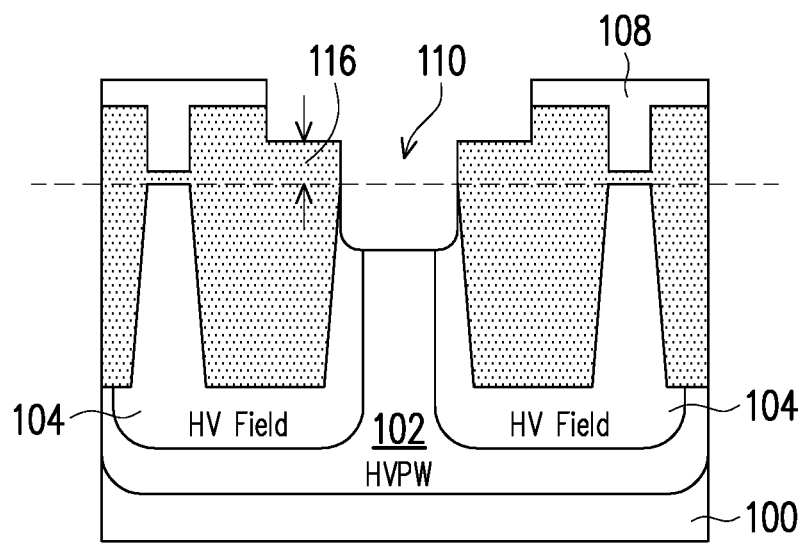

Referring to FIG. 3C, likewise to FIG. 2D, the sacrificial dielectric layer 114 is removed by etching process. In addition, the etching process may also etch trench isolations 106 to control the protruding portion 116 of the trench isolations 106 protruding from the substrate 100. As a result, the total depth of the recess 110 is corresponding to the thickness of a HV gate insulation layer 118.

Figure 3D:
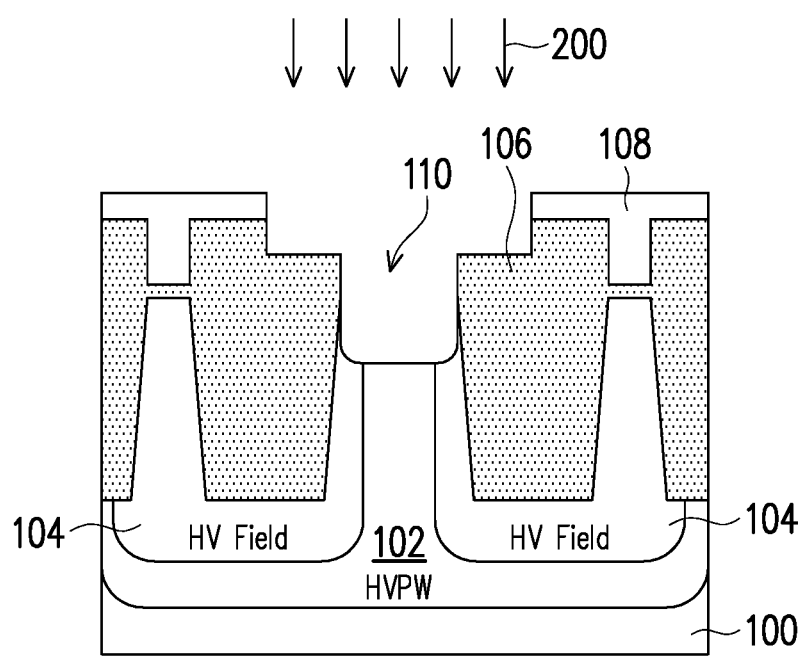

Referring to FIG. 3D, as noted, the hydrogen annealing process 200 is performed over the recess 110 on the recess bottom surface. The roughness at the recess bottom surface may be reduced due to silicon migration under the hydrogen annealing process 200. In an embodiment, the hydrogen annealing process 200 may use the pure hydrogen at a temperature in a range of 700° C. to 750° C. In addition, the operation duration may be few minutes and the pressure may be properly applied.

Figure 3E:
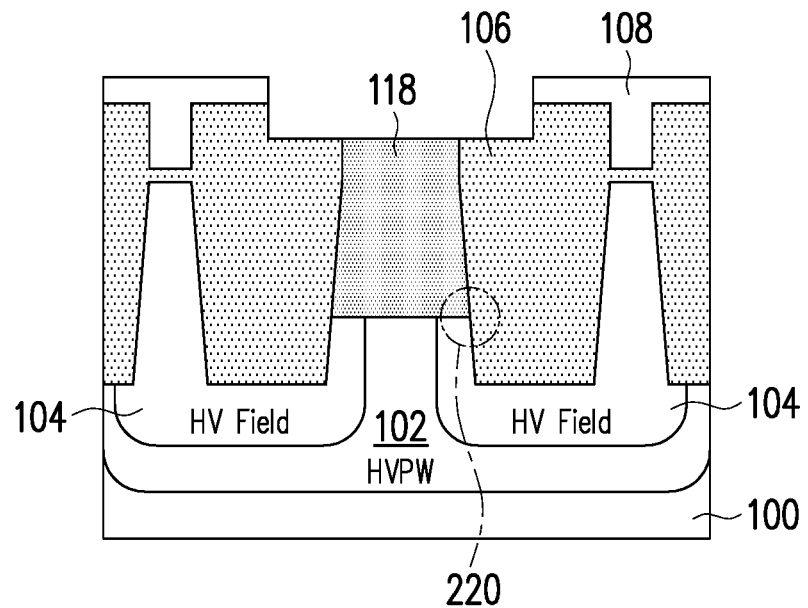
Figure 3E:
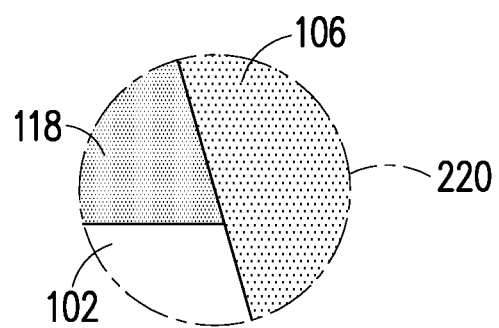

Referring to FIG. 3E, after the hydrogen annealing process 200, the HV gate insulation layer 118 is formed by rapid thermal isolation process in an example to fill the space of the recess 110.

As noted, in the embodiment, the HV gate insulation layer 118 is interfacing with the recess portion of the substrate 100 between the trench isolations 106. The hydrogen annealing process 200 for silicon migration in FIG. 3D are performed after the sacrificial dielectric layer 114 is formed and removed to preliminarily reduce the surface roughness for the HV channel. However, the hydrogen annealing process 200 indeed improve the reduction of surface roughness. As a result, the interface surface between the HV gate insulation layer 118 and the substrate 100 is at smooth condition. In addition, the silicon horn 120 as observed in FIG. 1D may be effectively reduced. As inspecting on the edge region 220 of the substrate 100 in the recess 110, the silicon horn is substantially reduced while comparing with structure in the edge region 120 of FIG. 1D. The HV channel under the HV gate insulation layer 118 gets a smooth path in better condition for the channel current and the performance of HV channel may be improved.

Figure 4:
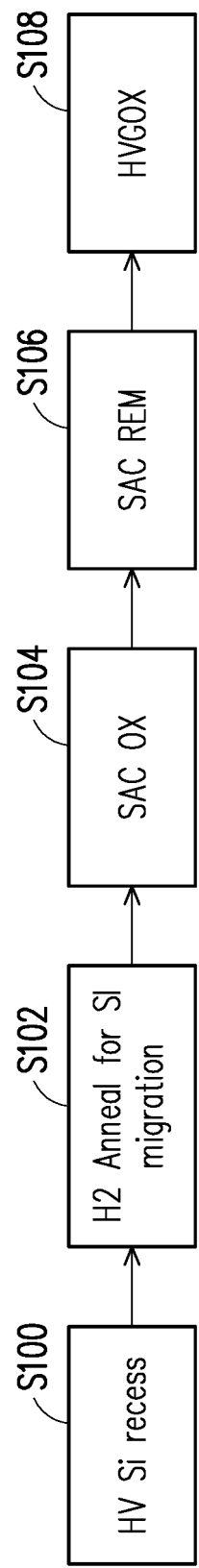
FIG. 4 is drawing, schematically illustrating a process flow of a method for fabricating a HV transistor, according to an embodiment of the invention.

FIG. 4 is drawing, schematically illustrating a process flow of a method for fabricating a HV transistor, according to an embodiment of the invention. Referring to FIG. 4, the fabrication procedure for fabricating a HV transistor according to the procedure in FIG. 2A to FIG. 2E may include multiples steps. In step S100, corresponding to FIG. 2A, a HV silicon recess 110 corresponding to HV channel may be formed based on a semi-finished structure. In step S102, the hydrogen annealing process 200 as referring to FIG. 2B is performed over the recess 110. In step S104, as also referring to FIG. 2C, the sacrificial (SAC) dielectric layer 114, such as SAC oxide (OX), is formed on the recess 110. In step S106, as also referring to FIG. 2D, the SAC dielectric layer 114 is removed (REM). In step S108, as also referring to FIG. 2E, the HV gate insulation layer 118, such as HV gate oxide layer (HVGOX), is formed to fill the recess 110.

Figure 5:
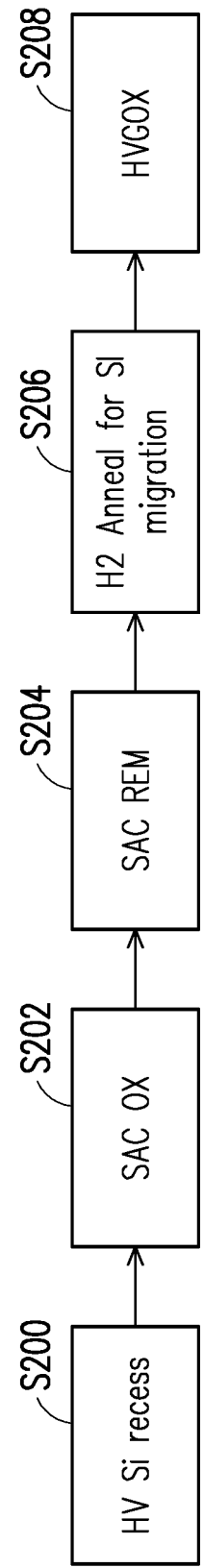
FIG. 5 is drawing, schematically illustrating a process flow of a method for fabricating a HV transistor, according to an embodiment of the invention.

Alternatively, FIG. 5 is drawing, schematically illustrating a process flow of a method for fabricating a HV transistor, according to an embodiment of the invention. Referring to FIG. 5, the fabrication procedure for fabricating a HV transistor according to the procedure in FIG. 3A to FIG. 3E may include multiples steps. In step S200, corresponding to FIG. 3A, a HV silicon recess 110 corresponding to HV channel may be formed based on a semi-finished structure. In step S202, as also referring to FIG. 3B, the SAC dielectric layer 114, such as SAC oxide (OX), is formed on the recess 110. In step S204, as also referring to FIG. 3C, the SAC dielectric layer 114 is removed (REM). In step S206, as also referring to FIG. 3D, the hydrogen annealing process 200 is performed over the recess 110. In step S208, as also referring to FIG. 3E, the HV gate insulation layer 118, such as HV gate oxide layer (HVGOX), is formed to fill the recess 110.

As to the foregoing descriptions, the hydrogen annealing process 200 is performed on the region of the substrate as preserved to be formed as HV channel. The surface roughness may be further reduced while the sacrificial dielectric layer in combination with the hydrogen annealing process 200 are performed to treat the HV channel surface. The silicon horn at the edge region of the HV channel may also be effectively reduced. The performance of the HV channel may be improved.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A method for fabricating a high-voltage (HV) transistor, comprising:
providing a substrate, having a first isolation structure and a second isolation structure in the substrate and a recess in the substrate between the first and second isolation structures;
performing a hydrogen annealing process over the recess;
forming a sacrificial dielectric layer on the recess;
removing the sacrificial dielectric layer and a portion of the first and second isolation structures in one etching process from top surfaces of the first and second isolation structures so that a protruding portion of each of the first and second isolation structures protrudes from the substrate and a top surface of the protruding portion is not lower than an uppermost surface of the substrate and lower than uppermost surfaces of the first and second isolation structures; and
entirely filling a gate oxide layer in the recess between the first and second isolation structures after the hydrogen annealing process.

2. The method of claim 1, wherein the hydrogen annealing process is performed at a temperature in a range of 700° C. to 750° C.

3. The method of claim 1, wherein the substrate has a doped structure including:
a doped well region in the substrate, wherein the first and second isolation structures are in the doped well region and the recess is also in doped well region;
a first HV field doped region, in the doped well region, surrounding a bottom surface of the first trench isolation; and
a second HV field doped region, in the doped well region, surrounding a bottom surface of the second trench isolation,
wherein a gap is between the first HV field doped region and the second HV field doped region under the recess.

4. The method of claim 3, wherein the doped structure in the substrate is formed before the recess is formed.

5. The method of claim 1, wherein the hydrogen annealing process smooths a roughness of a bottom surface of the recess, including reducing a horn structure at bottom periphery of the recess between the substrate and the first and second isolation structures.

6. The method of claim 1, wherein the sacrificial dielectric layer is formed by performing a rapid thermal oxidation over the recess.

7. The method of claim 1, wherein the gate oxide layer is a HV gate oxide layer and a bottom of the gate oxide layer is between a top and a bottom of the first trench isolation structure or the second trench isolation structure.

8. The method of claim 1, wherein the substrate includes an epitaxial silicon layer formed on a base substrate, and the first and second trench isolation are in the epitaxial silicon layer.

9. The method of claim 1, wherein the step of forming the gate oxide layer includes a thermal oxidation layer to oxidize the substrate within the recess.

10. The method of claim 1, wherein a gas in the hydrogen annealing process is 100% of hydrogen.

* * * * *